(12) United States Patent
Nagatome

(10) Patent No.: US 6,816,417 B2
(45) Date of Patent: Nov. 9, 2004

(54) INPUT/OUTPUT BUFFER CIRCUIT

(75) Inventor: Toshihide Nagatome, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/254,644

(22) Filed: Sep. 26, 2002

(65) Prior Publication Data

US 2003/0151954 A1 Aug. 14, 2003

(30) Foreign Application Priority Data

Feb. 8, 2002 (JP) ........................................ 2002-032500

(51) Int. Cl.[7] ................................................ G11C 7/00
(52) U.S. Cl. .............................. 365/189.05; 365/189.04
(58) Field of Search ........................ 365/189.05, 189.01, 365/230.06, 189.04, 230.08

(56) References Cited

U.S. PATENT DOCUMENTS 5,278,789 A * 1/1994 Inoue et al. ............ 365/189.01

* cited by examiner

Primary Examiner—Thong Q. Le
(74) Attorney, Agent, or Firm—Volentine Francos, PLLC

(57) ABSTRACT

An input/output buffer circuit is capable of suppressing an increase in current consumption of the whole system even in a low power consumption mode for bringing a clock to a halt. The input/output buffer circuit has an input/output terminal for performing the input/output of data. When a write enable signal WR is in an active state, the input/output buffer circuit outputs a signal to the input/output terminal. When a read enable signal RD is in an active state, the input/output buffer circuit receives data from the input/output terminal. When the write enable signal WR and the read enable signal RD are both in a non-active state, the input/output buffer circuit outputs a signal based on any of signals supplied thereto.

19 Claims, 2 Drawing Sheets

INPUT/OUTPUT BUFFER CIRCUIT

BACKGROUND OF THE INVENTION

The present invention relates to an input/output buffer circuit suitable for use in a microcomputer or the like, which controls an external bus connected to an input/output terminal.

A microcomputer or the like is provided with an input/output buffer circuit for controlling an external bus. The input/output buffer circuit is connected to a data bus connected to an input/output terminal and mainly controlled by a read enable signal RD and a write enable signal WR. Since the data bus is a bidirectional bus, it needs to be placed under input/output control.

In general, a read enable signal RD or a timing signal similar thereto is used as an input-permitting control signal. Further, a write enable signal WR or a timing signal similar thereto is used as an output-permitting control signal. There might be a case in which a write enable signal WR or a timing signal similar thereto is used only as a control signal for always allowing the input and output without using a control signal for allowing the input.

Since, however, the write enable signal WR or timing signal similar thereto used as the output-permitting control signal is not active in the input/output buffer circuit having the above configuration during its access-to-outside free time, the output of the data bus results in high impedance Hiz. Since the read enable signal RD becomes negative when the write enable signal WR is active, the data bus is brought to the high impedance Hiz when no output is transferred even from an external part connected to the input/output terminal.

General externally connected parts might include one in which a through current flows in an input gate thereof when a data bus connected to an input/output terminal on the microcomputer side is brought to the high impedance Hiz. Therefore, a problem arises in that a system including the microcomputer and the externally connected parts increases in current consumption. This becomes a big problem in a low power consumption mode for bringing a clock to a halt in particular. As a measure against it, a measure might be taken for pulling up or down the data bus or externally providing a bus hold circuit so as to prevent the data bus from being brought to the high impedance Hiz. However, the measure involves a problem in that current consumption at the operation of the data bus increases in reverse.

SUMMARY OF THE INVENTION

The present invention may provide an input/output buffer circuit capable of suppressing an increase in current consumption of the whole system even in a low power consumption mode for bringing a clock to halt.

The input/output buffer circuit according to the invention of the present application has an input/output terminal for performing the input/output of data, and outputs a signal to the input/output terminal when a write enable signal is in an active state and receives data from the input/output terminal when a read enable signal is in an active state.

The input/output buffer circuit according to the invention of the present application outputs a signal based on any of signals supplied thereto when the write enable signal and the read enable signal are both in a non-active state.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
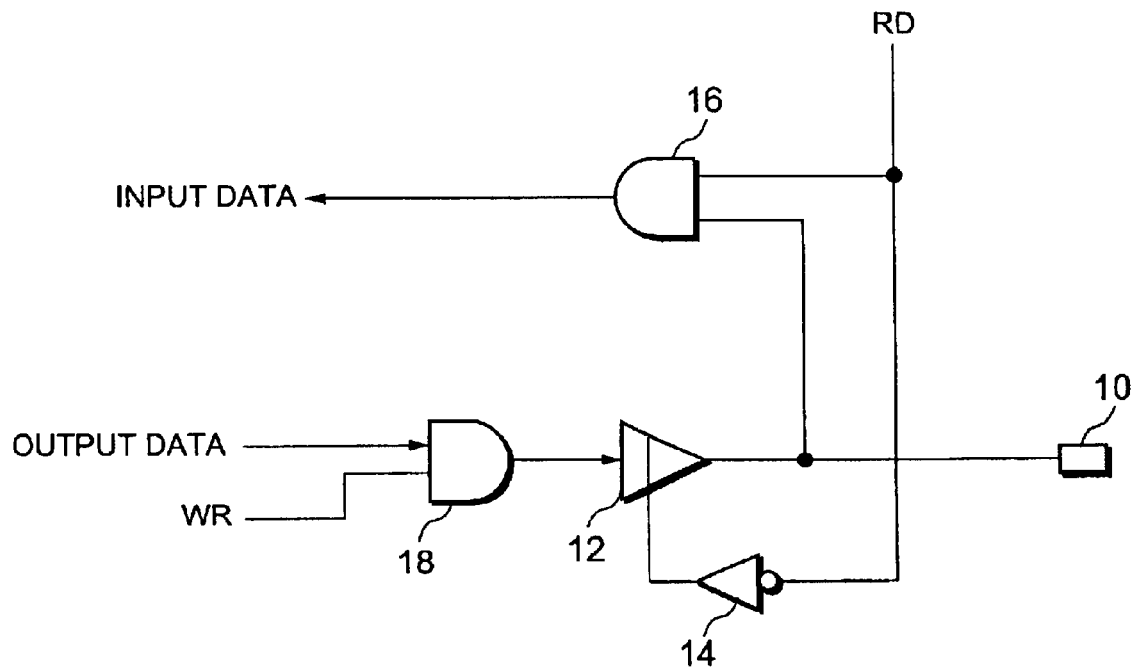
FIG. 1 is a circuit diagram showing an input/output buffer circuit according to a first embodiment of the present invention.

FIG. 1 is a circuit diagram showing a first embodiment of the present invention. An input/output buffer circuit showing the first embodiment, which is connected to an input/output terminal 10, comprises a buffer circuit 12 with an enable terminal, an inverter 14, a first AND circuit 16, and a second AND circuit 18. The input/output terminal 10 is electrically connected to a first input of the first AND circuit 16, and a read enable signal RD is supplied to a second input thereof. An output of the first AND circuit 16 is transferred to the inside of the circuit as input data.

A first input of the second AND circuit 18 is supplied with output data from inside the circuit, and a second input thereof is supplied with a write enable signal WD. The output of the second AND circuit 18 outputs output data therefrom only when the write enable signal WD is of an H level (active level).

The buffer circuit 12 is a circuit which outputs a signal received at its input therefrom only when a signal having an active level is inputted to the enable terminal thereof, and which brings an output into high impedance Hiz regardless of the level of the signal received at its input when a signal having a disable level is received at the enable terminal.

The input of the buffer circuit 12 with the enable terminal is electrically connected to the output of the second AND circuit 18, and the output thereof is electrically connected to the input/output terminal 10. The enable terminal of the buffer circuit 12 is supplied with a signal obtained by inverting the read enable signal RD by means of the inverter 14.

Figure 2:
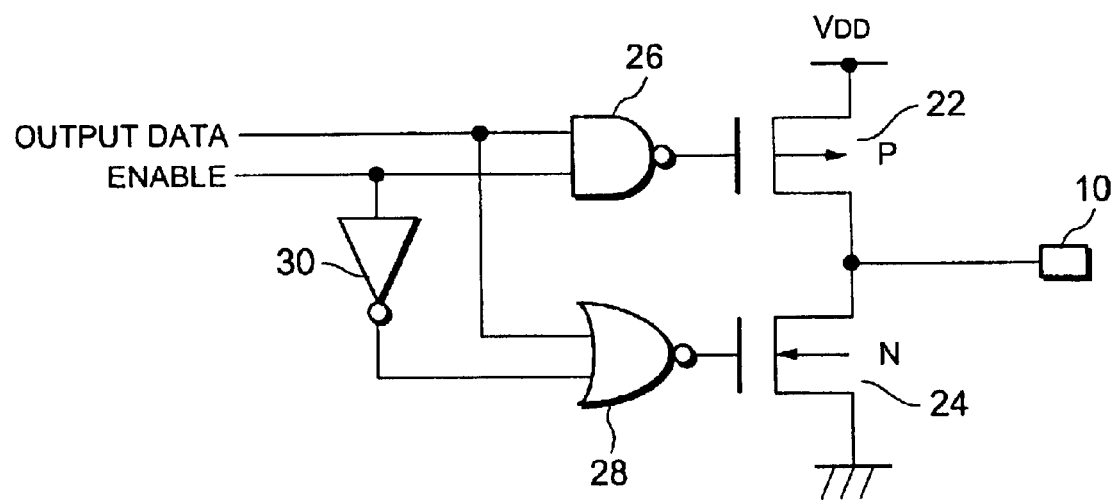
FIG. 2 is a diagram illustrating an example of a buffer circuit with an enable terminal.

As a specific circuit of the buffer circuit 12 with the enable terminal, may be illustrated such a circuit as shown in FIG. 2 by way of example. The buffer circuit shown in FIG. 2 comprises a PMOS transistor 22, an NMOS transistor 24, a NAND circuit 26, a NOR circuit 28, and an inverter 30. The PMOS transistor 22 and NMOS transistor 24 are electrically connected in series between a power source VDD and the ground, and the input/output terminal 10 is electrically connected to their connecting point.

A first input of the NAND circuit 26 is supplied with output data sent from inside the circuit, whereas a second input thereof is supplied with a signal obtained by inverting a signal (represented as an enable signal Enable in the present circuit) supplied to an enable terminal of the inverter 30 by means of the inverter 30. A first input of the NOR circuit 28 is supplied with the output data sent from inside the circuit, whereas a second input thereof is supplied with the enable signal Enable. The output of the NAND circuit 26 is electrically connected to its corresponding gate of the PMOS transistor 22, and the output of the NOR circuit 28 is electrically connected to its corresponding gate of the NMOS transistor 24.

The buffer circuit 12 shown in FIG. 2 outputs output data to the input/output terminal 10 when the enable signal Enable is of an H level (active level). When, however, the enable signal Enable is of an L level, the output of the buffer circuit 12 is brought to high impedance.

Incidentally, various circuits have been considered as the buffer circuit 12 even except for the buffer circuit 12 as shown in FIG. 2. In the present invention, even circuits other than one shown in FIG. 2 can be utilized if they are circuits each switched to either a high impedance state or a normal output state in response to the enable signal Enable.

The operation of the input/output buffer circuit shown in FIG. 1 will next be described.

Since the read enable signal RD is brought to an H level (active level) when the input/output buffer circuit is in an input state, a signal supplied to the input/output terminal 10 from an externally connected circuit is transferred to the inside thereof via the first AND circuit 16. On the other hand, since the buffer circuit 12 is supplied with a signal (corresponding to a signal of an L level) obtained by inverting a read enable signal RD by means of the inverter 14, the buffer circuit 12 is brought into a high impedance state regardless of a signal inputted thereto. Thus, the signal supplied to the input/output terminal 10 does not undergo interference of the buffer circuit 12.

When the input/output buffer circuit is in an output state, the read enable signal RD is brought to an L level (non-active level). Thus, since the buffer circuit 12 is supplied with a signal (corresponding to a signal of an H level) obtained by inverting the read enable signal RD by means of the inverter 14, the buffer circuit 12 outputs the signal inputted thereto. On the other hand, since a write enable signal WR reaches an H level (active level), output data supplied to the second AND circuit 18 is transferred to the buffer circuit 12. Accordingly, the output data is transferred to the input/output terminal 10.

During a period in which the input/output buffer circuit is held neither in the output state nor in the input state, the read enable signal RD and the write enable signal WR reach the L level (non-active level). Thus, since the buffer circuit 12 is supplied with a signal (corresponding to a signal of an H level) obtained by inverting the read enable signal RD by means of the inverter 14, the buffer circuit 12 outputs the signal inputted thereto. However, since the write enable signal WR is brought to the L level (non-active level), the output of the second AND circuit 18 is fixed to the L level. Accordingly, the buffer circuit 12 outputs the signal of the L level therefrom.

Since, as described above, the input/output buffer circuit according to the first embodiment of the present invention outputs the L level signal even during the period in which it is held neither in the output state nor in the input state, the L level signal is supplied even to an input buffer for the external device connected to the input/output terminal 10. It is thus possible to prevent the occurrence of a through current due to the input buffer of the external device connected to the input/output terminal 10 being responsive to the input having high impedance.

Figure 3:
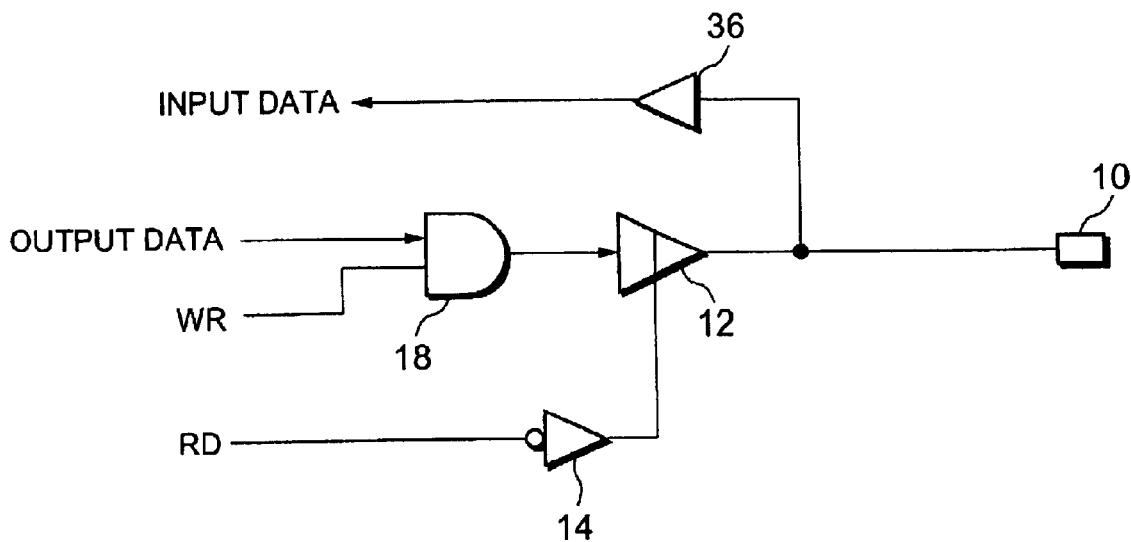
FIG. 3 is a circuit diagram depicting an input/output buffer circuit according to a second embodiment of the present invention.

FIG. 3 is a circuit diagram showing an input/output buffer circuit according to a second embodiment of the present invention. In FIG. 3, the same elements of structure are identified by the same reference numerals and the description thereof will therefore be omitted. The input/output buffer circuit according to the second embodiment is different from the input/output buffer circuit according to the first embodiment in that a buffer circuit 36 is provided as an alternative to the first AND circuit 16. Since the buffer circuit 36 is not placed under the control of a read enable signal RD, it always transfers a signal at an input/output terminal 10 to the inside thereof. Thus, when the input/output buffer circuit is held in an input state, it operates in a manner similar to the first embodiment. When the input/output buffer circuit is held in an output state, it transfers a signal outputted from a buffer circuit 12 with an enable terminal to an internal circuit as it is. While the input/output buffer circuit transfers the output signal of the buffer circuit 12 to the internal circuit as it is even during a period in which the input/output buffer circuit is held neither in the output state nor in the input state, the input/output buffer circuit results in an operation similar to the first embodiment because the output signal of the buffer circuit 12 is L in level.

The input/output buffer circuit according to the second embodiment operates in a manner similar to that according to the first embodiment except when output data is inputted to the inside of the input/output buffer circuit as input data as it is when it is held in the output state. Thus, the input/output buffer circuit according to the second embodiment has the advantage that the output data can be brought to the inside thereof in the output state, in addition to the advantage of the input/output buffer circuit according to the first embodiment.

Figure 4:
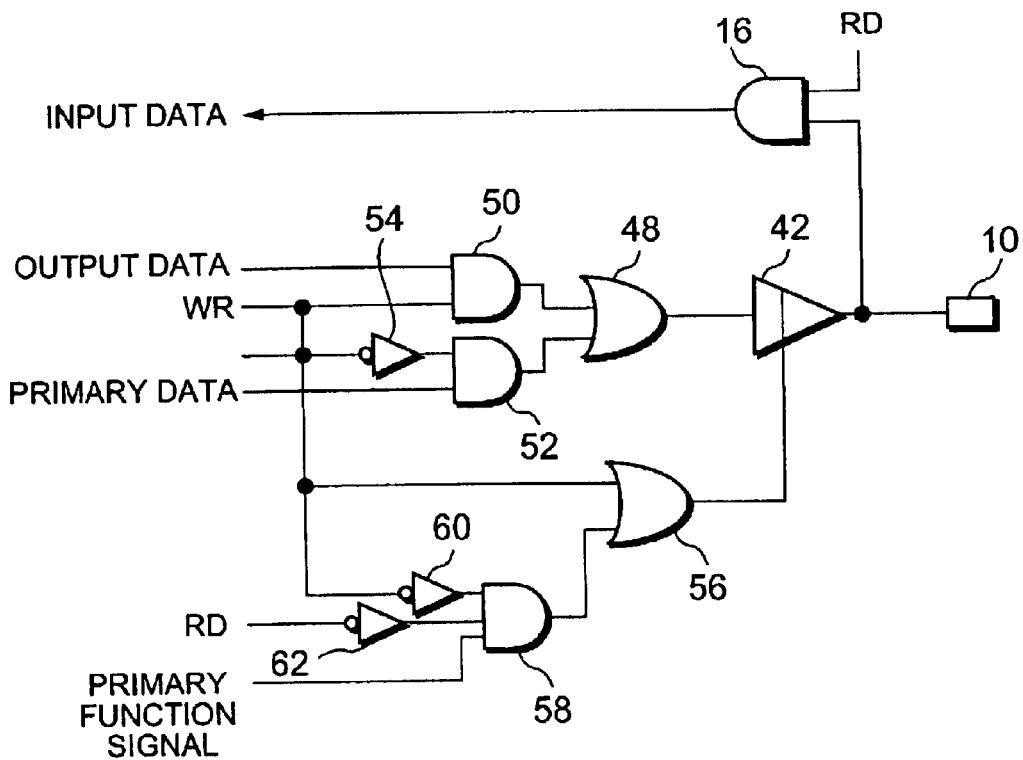
FIG. 4 is a circuit diagram showing an input/output buffer circuit according to a third embodiment of the present invention.

FIG. 4 is a circuit diagram showing an input/output buffer circuit according to a third embodiment of the present invention. The input/output buffer circuit according to the third embodiment is different from the input/output buffer circuit according to the first embodiment in that an enable terminal of a buffer circuit 42 provided with it s supplied with a signal obtained by taking the logic of a read enable signal RD, a write enable signal WR and a primary function signal, and the input of the buffer circuit 42 is supplied with a signal obtained by taking the logic of output data, primary data and the write enable signal WR.

Described specifically, the input of a first AND circuit 50 is supplied with the output data and the write enable signal WR, and the output thereof is electrically connected to one input of a first OR circuit 48. The inputs of a second AND circuit 52 are respectively supplied with the primary data and a signal obtained by inverting the write enable signal WR by means of a first inverter, and the output thereof is electrically connected to the other input of the first OR circuit 48. The output of the first OR circuit 48 is electrically connected to the input of the buffer circuit 42.

A third AND circuit 58 has three inputs. The first input thereof is supplied with the primary function signal, the second input thereof is supplied with a signal obtained by inverting the read enable signal RD by means of a second inverter 62, and the third input thereof is supplied with a signal obtained by inverting the write enable signal WR by means of a third inverter 60, respectively. The output of the third AND circuit 58 is connected to one input of a second OR circuit 56. The other input of the second OR circuit 56 is supplied with the write enable signal WR, and the output of the second OR circuit 56 is electrically connected to the enable input of the buffer circuit 42 provided with the enable terminal.

Since the inverted signal of the write enable signal RD is inputted to the enable input of the buffer circuit 42 with the enable terminal regardless of other signals when the input/output buffer circuit according to the third embodiment is held in an input state, the input/output buffer circuit results in the same operation as that according to the first embodiment.

Since the write enable signal WR is of an H level when the input/output buffer circuit is held in an output state, the first AND circuit 50 outputs output data therefrom, and the second AND circuit 52 outputs an L level signal regardless of the primary data. Accordingly, the first OR circuit 48 outputs the output data therefrom. On the other hand, the second OR circuit 56 outputs an H level of the write enable signal WR regardless of one input (output of the third AND circuit 58). Thus, the input/output buffer circuit still results in an operation similar to that according to the first embodiment.

During a period in which the input/output buffer circuit is held neither in the output state nor in the input state, the read enable signal RD and the write enable signal WR are respectively brought to an L level (non-active level). Accordingly, the first AND circuit 50 outputs an L level signal regardless of the output data, and the second And circuit 52 outputs the primary data therefrom. Thus, the first OR circuit 48 outputs the primary data therefrom.

On the other hand, since the third AND circuit 58 outputs the primary function signal therefrom, and the second OR circuit 56 also allows the primary function signal to pass therethrough, the buffer circuit 42 with the enable terminal outputs the primary data when the primary function signal is of an H level, whereas when the primary function signal is of an L level, the buffer circuit 42 is brought into a high impedance state. Thus, whether the buffer circuit 42 is brought to the high impedance state or outputs the primary data, is controlled based on the primary function signal during the period in which it is held neither in the output state or in the input state.

According to the invention of the present application as described above in detail, since an L level signal is outputted from an input/output terminal even during a period in which neither of an output state and an input state is taken, it is possible to prevent the occurrence of a through current in an input buffer of an external device connected to the input/output terminal.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An input/output buffer circuit comprising:
    an input/output terminal for performing the input/output of data;
    an input circuit for transferring data from the input/output terminal when a read enable signal is an active state and providing a first predetermined signal when the read enable signal is a non-active state;
    an output circuit for outputting a signal to the input/output terminal when a write enable signal is in an active state and the read enable signal is in the non-active state, outputting a second predetermined signal when the write enable signal is in a non-active state and the read enable signal is in the non-active state, and being in a high impedance state when the read enable signal is an active state.

2. The input/output buffer circuit according to claim 1, wherein the output circuit includes a buffer circuit with an enable terminal, and wherein an inverted signal of the read enable signal is inputted to the enable terminal of the buffer circuit.

3. The input/output buffer circuit according to claim 2, wherein the output circuit further includes a logic circuit for outputting output data to the buffer circuit when the write enable signal is in the active state and outputting primary data to the buffer circuit when the write enable signal is in the non-active state.

4. The input/output buffer circuit according to claim 2, wherein the output circuit further includes a logic circuit for outputting a primary function signal to the enable terminal of the buffer circuit when the write enable signal and the read enable signal are both in the non-active state.

5. An input/output buffer circuit comprising:
    an input/output terminal for receiving an input signal and for outputting an output signal;
    an input circuit connected to the input/output terminal, the input circuit transferring the input signal when a read enable signal is in an active state and the input circuit outputting a predetermined signal when the read enable signal is in an inactive state; and
    an output circuit connected to the input/output terminal, the output circuit outputting the output signal when a write enable signal is in the active state and the read enable signal is in the inactive state, the output circuit outputting a predetermined signal when the read enable signal and the write enable signal are in the inactive state, and the output circuit outputting a high impedance signal when the read enable signal is in the active state.

6. An input/output buffer circuit according to claim 5, wherein the input circuit is a gate circuit having a first input connected to the input/output terminal, a second input connected to receive the read enable signal and an output for outputting the input signal.

7. An input/output buffer circuit according to claim 6, wherein the gate circuit is an AND circuit.

8. An input/output buffer circuit according to claim 5, wherein the output circuit includes
    a gate circuit having a first input connected to receive the output signal, a second input connected to receive the write enable signal and an output, and
    an enabled buffer circuit having an input connected to the output of the gate circuit, an output connected to the input/output terminal and an enable terminal connected to receive the write enable signal, the enabled buffer circuit transferring a signal when the received write enable signal is in the inactive state, the enabled buffer circuit outputting the high impedance signal when the received write enable signal is in the active state.

9. An input/output buffer circuit according to claim 8, wherein the gate circuit is an AND circuit.

10. An input/output buffer circuit according to claim 8, further comprising a primary circuit connected between the gate circuit and the enabled buffer circuit, the primary circuit transferring a signal when a primary data signal is in an active state and the primary circuit outputting the predetermined signal when the primary data signal is in an inactive state.

11. An input/output buffer circuit according to claim 8, further comprising a primary function circuit connected to the enabled buffer circuit, the primary function circuit makes the enabled buffer circuit transfer the signal when the write enable signal and the read enable signal are in the inactive state and a primary function signal is in an active state, the primary function circuit makes the enabled buffer circuit output the predetermined signal when one of the write enable signal or the read enable signal is in the active state or the primary function signal is in an inactive state.

12. An input/output buffer circuit comprising:
an input/output terminal for receiving an input signal and for outputting an output signal;
an input circuit connected to the input/output terminal, the input circuit transferring the input signal; and
an output circuit connected to the input/output terminal, the output circuit outputting the output signal when a write enable signal is in an active state and a read enable signal is in an inactive state, the output circuit outputting a predetermined signal when a read enable signal and the write enable signal are in an inactive state, the output circuit outputting a high impedance signal when the read enable signal is in an active state.

13. An input/output buffer circuit according to claim 12, wherein the input circuit is a buffer circuit.

14. An input/output buffer circuit according to claim 12, wherein the output circuit includes
a gate circuit having a first input connected to receive the output signal, a second input connected to receive the write enable signal and an output, and
an enabled buffer circuit having an input connected to the output of the gate circuit, an output connected to the input/output terminal and an enable terminal connected to receive the write enable signal, the enabled buffer circuit transferring a signal when the received write enable signal is in the inactive state, the enabled buffer circuit outputting the high impedance signal when the received write enable signal is in the active state.

15. An input/output buffer circuit according to claim 14, wherein the gate circuit is an AND circuit.

16. An input/output buffer circuit according to claim 14, further comprising a primary circuit connected between the gate circuit and the enabled buffer circuit, the primary circuit transferring a signal when a primary data signal is in an active state and the primary circuit outputting the predetermined signal when the primary data signal is in an inactive state.

17. An input/output buffer circuit according to claim 14, further comprising a primary function circuit connected to the enabled buffer circuit, the primary function circuit makes the enabled buffer circuit transfer the signal when the write enable signal and the read enable signal are in the inactive state and a primary function signal is in an active state, the primary function circuit makes the enabled buffer circuit output the predetermined signal when one of the write enable signal or the read enable signal is in the active state or the primary function signal is in an inactive state.

18. An input/output buffer circuit according to claim 8, wherein the enabled buffer circuit comprises:
a PMOS transistor having a gate, a source connected to supply a power potential, and a drain connected to the input/output terminal;
a NAND circuit having an output connected to the gate of the PMOS transistor, a first input connected to receive the output enable signal, and a second input;
a NOR circuit having an output connected to the gate of the NMOS transistor, a first input connected to receive the output enable signal, and a second input connected to receive the read enable signal; and
an inverter having an input connected to receive the read enable signal and an output connected to the second input of the NAND circuit.

19. An input/output buffer circuit according to claim 14, wherein the enabled buffer circuit comprises:
a PMOS transistor having a gate, a source connected to supply a power potential, and a drain connected to the input/output terminal;
an NMOS transistor having a gate, a source connected to supply a ground potential, and a drain connected to the input/output terminal;
a NAND circuit having an output connected to the gate of the PMOS transistor, a first input connected to receive the output enable signal, and a second input;
a NOR circuit having an output connected to the gate of the NMOS transistor, a first input connected to receive the output enable signal, and a second input connected to receive the read enable signal and an output connected to the second input of the NAND circuit.

* * * * *